(12) United States Patent
Kim et al.

(10) Patent No.: US 12,180,403 B2
(45) Date of Patent: Dec. 31, 2024

(54) QUANTUM DOT, METHOD OF MANUFACTURING QUANTUM DOT, AND ELECTRONIC ELEMENT

(71) Applicant: Duk San Neolux Co., Ltd, Cheonan-si (KR)

(72) Inventors: Do Eon Kim, Cheonan (KR); Jong Moon Shin, Cheonan (KR); Chang Min Lee, Cheonan (KR); Hyung Dong Lee, Cheonan (KR)

(73) Assignee: Duk San Neolux Co., Ltd., Cheonan-si (KR)

(*) Notice: Subject to any disclaimer, the term of this patent is extended or adjusted under 35 U.S.C. 154(b) by 102 days.

(21) Appl. No.: 17/572,928

(22) Filed: Jan. 11, 2022

(65) Prior Publication Data
US 2022/0220377 A1    Jul. 14, 2022

(30) Foreign Application Priority Data

Jan. 12, 2021  (KR) ............... 10-2021-0003816

(51) Int. Cl.
| | | |
|---|---|---|
| *C09K 11/71* | (2006.01) | |
| *C09K 11/08* | (2006.01) | |
| *C09K 11/62* | (2006.01) | |
| *C09K 11/70* | (2006.01) | |
| *C09K 11/74* | (2006.01) | |
| *H01L 33/50* | (2010.01) | |
| *H10K 50/115* | (2023.01) | |

(Continued)

(52) U.S. Cl.
CPC .......... *C09K 11/71* (2013.01); *C09K 11/0883* (2013.01); *C09K 11/703* (2013.01); *H10K 50/115* (2023.02); *B82Y 20/00* (2013.01); *B82Y 40/00* (2013.01)

(58) Field of Classification Search
CPC ... C09K 11/62; C09K 11/625; C09K 11/0883; C09K 11/0855; C09K 11/7492; C09K 11/703; C09K 11/71; C09K 11/7471; C09K 11/753; C09K 11/7421; C09K 11/025; C09K 11/56; C09K 11/70; H01L 33/502; H10K 50/115; B82Y 20/00; B82Y 40/00
See application file for complete search history.

(56) References Cited

U.S. PATENT DOCUMENTS

| | | | |
|---|---|---|---|
| 2018/0033856 A1* | 2/2018 | Kwon | C09K 11/70 |
| 2018/0163129 A1* | 6/2018 | Won | H01L 21/02601 |

FOREIGN PATENT DOCUMENTS

| | | | | |
|---|---|---|---|---|
| CN | 108929670 A | * | 12/2018 | B82Y 20/00 |
| WO | WO-2020209581 A1 | * | 10/2020 | C09K 11/02 |

OTHER PUBLICATIONS

WO-2020209581-A1 machine translation, 47 pages (Year: 2020).*
CN-108929670-A machine translation, 23 pages. (Year: 2018).*

* cited by examiner

*Primary Examiner* — Matthew E. Hoban
*Assistant Examiner* — Lynne Edmondson
(74) *Attorney, Agent, or Firm* — Harness, Dickey & Pierce, P.L.C.

(57) ABSTRACT

Provided are a quantum dot, a method of manufacturing the quantum dot, and an electronic device including the quantum dot. The quantum dot includes a core including a first semiconductor nanocrystal and a doping metal. The first semiconductor nanocrystal includes a group II element, a group III element, and a group V element. The quantum dot has a narrower full width at half maximum (FWHM) and superior quantum efficiency, and manufactured in a simple manner.

11 Claims, 3 Drawing Sheets

(51) Int. Cl.
*B82Y 20/00* (2011.01)
*B82Y 40/00* (2011.01)

QUANTUM DOT, METHOD OF MANUFACTURING QUANTUM DOT, AND ELECTRONIC ELEMENT

CROSS REFERENCE TO RELATED APPLICATION

This application claims priority from Korean Patent Application No. 10-2021-0003816, filed on Jan. 12, 2021, which is hereby incorporated by reference for all purposes as if fully set forth herein.

BACKGROUND

Field

Embodiments relate to a quantum dot, a method of manufacturing a quantum dot, and an electronic device.

Description of Related Art

Quantum dots (QDs) are semiconductor particles having a size of a few nanometers and having superior optical and electric properties that differ from bulk semiconductor materials. For example, quantum dots have characteristics of emitting light through photoluminescence (PL), in which light is generated as electrons drop down from the conduction band to the valence band, or electroluminescence (EL), in which light is generated by external charges. Even in the case in which the quantum dots are formed of the same material, the color of emission light may vary depending on the size of the quantum dots. Due to these characteristics, quantum dots are attracting attention for use in next-generation light-emitting diodes (LEDs), biosensors, lasers, solar cell nanomaterials, and the like.

However, there are problems in that it may be difficult to manufacture quantum dots, and the optical performance thereof may be degraded due to internal bonds occurring during manufacturing thereof. In addition, the size distribution of manufactured quantum dots may be excessively wide, and thus quantum dots, when produced, may have low color purity, which is problematic.

BRIEF SUMMARY

Embodiments may provide a quantum dot having superior color purity and light conversion efficiency, and which may be manufactured in a simple manner.

Embodiments may provide a method of manufacturing a quantum dot, by which quantum dots having superior color purity and light conversion efficiency may be manufactured in a simple manner.

Embodiments may provide an electronic device including quantum dots having superior color purity and light conversion efficiency.

According to an aspect, embodiments provide a quantum dot including a core including a first semiconductor nanocrystal and a doping metal.

The first semiconductor nanocrystal may include a group II element, a group III element, and a group V element.

The doping metal may be selected from alkaline metals and alkaline earth metals.

The ratio between the number of moles of the group III element of the first semiconductor nanocrystal and the number of moles of the doping metal may range from 1:0.001 to 1:0.2.

The ratio between the number of moles of the group III element of the first semiconductor nanocrystal and the number of moles of the doping metal may range from 1:0.01 to 1:0.2.

The ratio between the number of moles of the group III element in the first semiconductor nanocrystal and the number of moles of the group II element in the first semiconductor nanocrystal may range from 1:5 to 1:10.

The first semiconductor nanocrystal may include In, Zn, and P.

The doping metal may include one or more selected from Sr and Ba.

The quantum dot may further include a shell including a second semiconductor nanocrystal including a group II element and a group VI element.

The ratio between the number of moles of the group III element in the quantum dot and the number of moles of the group II element in the quantum dot may range from 1:16 to 1:25.

According to another aspect, embodiments provide a method of manufacturing a quantum dot.

The method may include a step of forming a core including a first semiconductor nanocrystal and a doping metal, the first semiconductor nanocrystal including a group II element, a group III element, and a group V element.

The step of forming the core may include a 1-1 step and a 1-2 step.

The 1-1 step may raise the temperature to a temperature range of from 100° C. to 200° C. while decompressing a mixture solution in which a doping metal precursor and a group II element precursor solution are added to a group III element precursor solution.

The 1-2 step may raise the temperature of the mixture solution, the temperature of which has been raised in the step 1-1, to a temperature range of from 200° C. to 400° C. in an inert atmosphere and adding a group V element precursor solution to the temperature-raised mixture solution.

The method may further include a step of forming one or more shells surrounding the core.

According to another aspect, embodiments provide an electronic device including the quantum dot according to embodiments.

According to embodiments, provided are quantum dots which have superior color purity and light conversion efficiency and may be manufactured in a simple manner, a method of manufacturing such quantum dots, and an electronic device including such quantum dots.

In addition, according to embodiments, provided are quantum dots respectively including a first semiconductor nanocrystal including a group II element, a group III element, and a group V element and a core including a doping metal selected from alkaline metals and alkaline earth metals, whereby the quantum dots may have superior color purity and light conversion efficiency while being manufactured in a simple manner.

DESCRIPTION OF DRAWINGS

The above and other objectives, features, and advantages of the present disclosure will be more clearly understood from the following detailed description, taken in conjunction with the accompanying drawings, in which.

DETAILED DESCRIPTION

Figure 1:
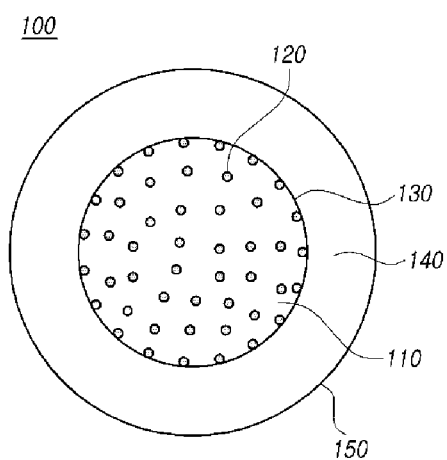
FIG. 1 is a schematic view illustrating the structure of a quantum dot according to embodiments.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted in the case in which the subject matter of the present disclosure may be rendered unclear thereby.

It will be understood that the terms "comprise", "have", "consist of", and any variations thereof used herein are intended to cover non-exclusive inclusions unless explicitly stated to the contrary. Descriptions of elements in the singular form used herein are intended to include descriptions of elements in the plural form, unless explicitly stated to the contrary.

In addition, terms, such as first, second, A, B, (a), or (b), may be used herein when describing elements of the present disclosure. Each of these terminologies is not used to define an essence, order, or sequence of a corresponding element but used merely to distinguish the corresponding element from other elements.

It will be understood that when an element is referred to as being "connected", "coupled", or "joined" to another element, not only can it be "directly connected, coupled, or joined" to the other element, but it can also be "indirectly connected, coupled, or joined" to the other element via an "intervening" element. Here, the intervening element may be included in one or more of the two elements "connected", "coupled", or "joined" to each other.

In addition, it will be understood that when an element is referred to as being "above" or "on" another element, not only can it be "directly" above or on the other element, but it can also be "indirectly" above or on the other element or layer via an "intervening" element. In contrast, when an element is referred to as being "directly" above or on another element, it will be understood that no intervening element is interposed. In addition, when an element is referred to as being "above" or "on" a reference portion, the element is positioned above or below the reference portion but is not necessarily positioned "above" or "on" the reference portion in the opposite direction of gravity.

When time relative terms, such as "after", "subsequent to", "next", "before", and the like, are used to describe elements, operating or manufacturing methods, and the like, these terms may be used to describe non-consecutive or non-sequential processes or operations unless the term "directly" or "immediately" is used together.

In addition, when any numerical values for elements or corresponding information are mentioned, it should be considered that numerical values for elements or corresponding information include a tolerance or error range that may be caused by various factors (e.g., process factors, internal or external impact, noise, etc.) even when a relevant description is not specified.

Unless otherwise stated, the term "halo" or "halogen", as used herein, refers to fluorine (F), chlorine (Cl), bromine (Br), or iodine (I).

Unless otherwise stated, the term "alkyl", "alkyl group", or "alkylene group" as used herein, has a single bond of 1 to 60 carbon atoms, and refers to saturated aliphatic functional radicals including a straight chain alkyl group, a branched chain alkyl group, a cycloalkyl (alicyclic) group, an alkyl-substituted cycloalkyl group, or a cycloalkyl-substituted alkyl group.

Unless otherwise stated, the term "alkenyl" or "alkenyl group" as used herein may have a double bond, include a straight chain group or a branched chain group, and have 2 to 60 carbon atoms.

Unless otherwise stated, the term "alkynyl" or "alkynyl group" as used herein may have a triple bond, include a straight chain group or a branched chain group, and have 2 to 60 carbon atoms.

Unless otherwise stated, the term "cycloalkyl" as used herein refers to, but is not limited to, alkyl forming a ring having 3 to 60 carbon atoms.

The term "alkoxyl group", "alkoxy group", or "alkyloxy group", as used herein, refers to an alkyl group to which an oxygen radical is attached, and unless otherwise stated, may have, but is not limited to, 1 to 60 carbon atoms. The term "alkenoxyl group", "alkenoxy group", "alkenyloxyl group", or "alkenyloxy group" refers to an alkenyl group to which an oxygen radical is attached, and unless otherwise stated, may have, but is not limited to, 2 to 60 carbon atoms.

The term "alkylthio group", as used herein, refers to an alkyl group to which a sulfur radical is attached, and unless otherwise stated, may have, but is not limited to, 1 to 60 carbon atoms.

Unless otherwise stated, the term "aryl group" or "arylene group", as used herein, has, but is not limited to, 6 to 60 carbon atoms. For example, the aryl group may be a phenyl group, a monovalent functional group of biphenyl, a monovalent functional group of naphthalene, a fluorenyl group, or a spirofluorenyl group.

The prefix "aryl" or "ar", as used herein, refers to a radical substituted with an aryl group. For example, an arylalkyl group is an alkyl group substituted with an aryl group, and an arylalkenyl group is an alkenyl group substituted with an aryl group. A radical substituted with an aryl group has carbon atoms, the number of which is as described herein. In addition, when prefixes are named consecutively, it means that the substituents are listed in the order described first. For example, an arylalkoxy group refers to an alkoxy group substituted with an aryl group, an alkoxylcarbonyl group refers to a carbonyl group substituted with an alkoxyl group, and an arylcarbonylalkenyl group refers to an alkenyl group substituted with an arylcarbonyl group. Here, the arylcarbonyl group is a carbonyl group substituted with an aryl group.

Unless stated otherwise, the term "fluorenyl group" or "fluorenylene group", as used herein, may refer to a monovalent or divalent functional group of fluorene. The term "substituted fluorenyl group" or "substituted fluorenylene group", as used herein, may refer to a monovalent or divalent functional group of substituted fluorene. The term "substituted fluorene" refers to a compound in which at least one of substituent R, R', R", or R'" to be described below is a functional group other than hydrogen, and includes a case in which R and R' are bonded to form a spiro compound together with carbon atoms attached thereto.

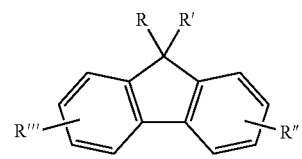

The term "spiro compound", as used herein, has "a spiro union", which refers to a union of two rings sharing only one atom. In this case, the atom shared by the two rings is referred to as a "spiro atom". Such spiro compounds are referred to as, for example, "monospiro", "dispiro", and "trispiro" compounds depending on the number of spiro atoms included in the compound.

The term "heterocyclic group", as used herein, includes not only aromatic rings, such as a "heteroaryl group" or a "heteroarylene group", but also aliphatic rings, and unless stated otherwise, refers to, but is not limited to, monocyclic and multicyclic rings each including one or more heteroatoms and having 2 to 60 carbon atoms.

Unless otherwise stated, the term "aliphatic group", as used herein, refers to, but is not limited to, aliphatic hydrocarbons each having 1 to 60 carbon atoms.

Unless otherwise stated, the term "aliphatic ring", as used herein, refers to, but is not limited to, aliphatic hydrocarbon rings each having 3 to 60 carbon atoms.

Unless stated otherwise, the term "heteroatom", as used herein, refers to N, O, S, P, or Si.

In addition, the "heterocyclic group", as used herein, may include rings having $SO_2$ in place of a ring-forming carbon atom. For example, the "heterocyclic group" may include the following compound:

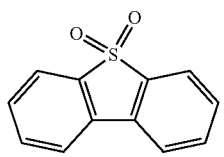 [SMILES: O=S1(=O)c2ccccc2-c2ccccc21]

The term "ring", as used herein, may refer to monocyclic rings and polycyclic rings, include not only hydrocarbon rings but also hetero rings including at least one heteroatom, and include aromatic rings and aliphatic rings.

The term "polycyclic ring", as used herein, includes ring assemblies, such as biphenyl or terphenyl, fused polycyclic systems, and spiro compounds. The polycyclic ring may include not only aromatic compounds but also aliphatic compounds, and include not only hydrocarbon rings but also hetero rings including at least one heteroatom.

Unless clearly stated otherwise, the term "substituted" in the term "substituted or non-substituted", as used herein, refers to substitution with one or more substituents selected from the group consisting of, but not limited to, deuterium, a halogen, an amino group, a nitrile group, a nitro group, a $C_1$-$C_{20}$ alkyl group, a $C_1$-$C_{20}$ alkoxy group, a $C_1$-$C_{20}$ alkyl amine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted with deuterium, a $C_8$-$C_{20}$ aryl alkenyl group, a silane group, a boron group, a germanium group, and a $C_2$-$C_{20}$ heterocyclic group including at least one heteroatom selected from the group consisting of O, N, S, Si, and P.

Herein, "the name of a functional group" corresponding to the aryl group, the arylene group, the heterocyclic group, or the like illustrated as each symbol and a substituent thereof may be written in "the name of the functional group on which the valence thereof is reflected" or may be written in "the name of the parent compound thereof". For example, phenanthrene, i.e., a type of aryl group, may be written in group names by distinguishing the valence. That is, a monovalent phenanthrene "group" may be written as "phenanthryl (group)", while a divalent phenanthrene "group" may be written as "phenanthrylene (group)". In contrast, phenanthrene groups may be written as "phenanthrene", i.e. the name of the parent compound, regardless of the valence. Similarly, pyrimidine may be written as "pyrimidine" regardless of the valence or may be written in group names each corresponding to the valence, in which a monovalent pyrimidine group is written as pyrimidinyl (group) and a divalent pyrimidine group is written as pyrimidinylen (group). Accordingly, when the type of a substituent is written in the name of the parent compound in this specification, the written name may refer to an n-valence "group" formed by the desorption of a carbon atom and/or a heteroatom-bonded hydrogen atom from the parent compound.

Herein, numbers or letters indicating positions may be omitted when describing the name of a compound or a substituent. For example, pyrido[4,3-d]pyrimidine may be described as pyridopyrimidine, benzofuro[2,3-d]pyrimidine may be described as benzofuropyrimidine, and 9,9-dimethyl-9H-fluorene may be described as dimethylfluorene. Thus, both benzo[g]quinoxaline and benzo[f]quinoxaline may be described as benzoquinoxaline.

In addition, unless clearly stated otherwise, formulas used herein may be applied in the same manner as the definition of the substituent based on the exponential definition of the following Formula:

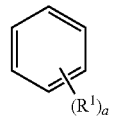

Here, when a is 0, there is no substituent $R^1$. When a is 1, a single substituent $R^1$ is attached to any one of the carbon atoms of the benzene ring. When a is 2 or 3, the substituent $R^1$ is attached in the following manner, where R1 may be of the same or different values. When a is an integer between 4 and 6, the substituent R1 is attached to a carbon atom of the benzene ring in a similar manner. Here, the illustration of hydrogen atoms attached to carbon atoms of the benzene ring will be omitted.

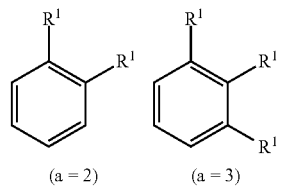

Herein, the expression "substituents bonded together to form a ring" refers to a case that a plurality of substituents bonded to each other form a saturated or unsaturated ring by sharing any atom, for example, at least one selected from a carbon atom and heteroatoms O, N, S, Si, and P. For example, naphthalene may be regarded as an unsaturated ring formed by a methyl group and a butadienyl group, which are substituted to one of benzene rings, are in vicinity of each other, and share one carbon atom, or an unsaturated ring formed by a vinyl group and a propylenyl group sharing one carbon atom. In addition, fluorine itself may be regarded to be an aryl group having 13 carbon atoms, or may also be regarded to be a compound in which two methyl groups substituted to biphenyl groups are bonded while sharing one carbon atom so as to form a ring.

An organic electronic device, as used herein, may refer to at least one component between an anode and a cathode, or an organic light-emitting diode (OLED) including an anode, a cathode, and at least one component situated between the anode and the cathode.

In some cases, the organic electronic device, as used herein, may refer to an OLED and a panel on which the OLED is disposed or an electronic device including a panel on which an OLED is disposed and a circuit. Here, examples of the electronic device may include, but are not limited to, a display device, an illumination device, a solar cell, a portable or mobile device (e.g., a smartphone, a tablet computer, a personal digital assistant (PDA), an electronic dictionary, or a portable media player (PMP)), a navigation terminal, a game machine, various TVs, and various computer monitors. The electronic device may be any type of device that include the above-described component(s).

The term "precursor", as used herein, means a chemical compound previously manufactured to cause a quantum dot to react. The precursor is a concept referring to all chemicals including metals, ions, elements, compounds, complexes, composites, clusters, and the like. The precursor is not necessarily limited to the last material of any reaction, but means a material that may be produced in any predetermined step.

The term "cluster", as used herein, refers to a group of tens to thousands of the same atoms or molecules or different atoms gathered or bound together.

The term "group", as used herein, refers to a group of in the periodic table. Here, "group I" may include group IA (or 1A) and group IB (or 1B), and examples of group I metals may include, but are not limited to, Li, Na, K, Ru, and Cs. "Group II" or group 2 may include group IIA (or 2A) and group IIB (or 2B), and examples of group II metals may include, but are not limited to, Cd, Zn, Hg, and Mg. "Group III" or group 3 may include group IIIA (or 3A) and group IIIB (or 3B), and examples of group III metals may include, but are not limited to, Al, In, Ga, and Tl. "Group IV" or group 4 may include group IVA (or 4A) and group IVB (or 4B), and examples of group IV metals may include, but are not limited to, Si, Ge, and Sn.

According to embodiments, a quantum dot is provided. The quantum dot according to embodiments may have a multilayer structure having a core/shell structure. In addition, the quantum dot 100 may have a core/multi-shell structure including two or more shells. For example, the quantum dot including a core and two shells may be expressed in the form of a core/shell/shell structure.

FIG. 1 is a schematic view illustrating the structure of a quantum dot 100 according to embodiments.

Referring to FIG. 1, the quantum dot 100 according to embodiments includes a core 130 including a first semiconductor nanocrystal 110 and a doping metal 120.

The first semiconductor nanocrystal 110 includes a group II element, a group III element, and a group V element.

The group II element may be, for example, one or more selected from Zn, Cd, and Hg. For example, the first semiconductor nanocrystal 110 may contain Zn as the group II element.

The group III element may be, for example, one or more selected from Al, Ga, In, and Ti. For example, the first semiconductor nanocrystal 110 may contain In as the group III element.

The group V element may be, for example, one or more selected from N, P, As, Sb, and Bi. For example, the first semiconductor nanocrystal 110 may contain P as the group V element.

The first semiconductor nanocrystal 110 may include a ternary compound. For example, the first semiconductor nanocrystal 110 may include one or more ternary compounds selected from InZnN, InZnP, InZnAs, InZnSb, InZnBi, GaZnN, GaZnP, GaZnAs, GaZnSb, GaZnBi, AlZnN, AlZnP, AlZnAs, AlZnSb, and AlZnTi.

The first semiconductor nanocrystal 110 may include a quaternary compound. For example, the first semiconductor nanocrystal 110 may include one or more quaternary compounds selected from InGaZnN, InGaZnP, InGaZnAs, InGaZnSb, InGaZnBi, InAlZnN, InAlZnP, InAlZnAs, InAlZnSb, InAlZnBi, GaAlZnN, GaAlZnP, GaAlZnAs, GaAlZnSb, and GaAlZnBi.

In the first semiconductor nanocrystal 110, the ratio A:B between the number of moles A of the group III element and the number of moles B of the group V element may range from 1:0.1 to 1:2 or 1:0.5 to 1:1. When the ratio between the number of moles of the group III element and the number of moles of the group V element meet the above range, a quantum dot 100 emitting visible light may be easily obtained.

In the first semiconductor nanocrystal 110, the ratio A:B between the number of moles A of the group III element and the number of moles B of the group II element may range from 1:5 to 1:10, 1:6 to 1:9, or 1:7 to 1:8. When the ratio between the number of moles of the group III element and the number of moles of the group II element meet the above range, a quantum dot 100 having a narrower full width at half maximum (FWHM) and superior quantum efficiency may be easily obtained.

The first semiconductor nanocrystal 110 should include a sufficient number of atoms of the group II element such that the ratio A:B between the number of moles A of the group III element and the number of moles B of the group II element meets the above-described range. In order to form the first semiconductor nanocrystal 110 including a sufficient number of atoms of the group II element, metal OXO clusters, for example, may be used as the precursor of the group II element.

The core 130 includes the doping metal 120. The doping metal 120 may serve to stabilize and complement the lattice of first semiconductor nanocrystal 110 in the core 130.

The core 130 including the first semiconductor nanocrystal 110 and the doping metal 120 may be expressed in the form of "core:doping metal" or "first semiconductor nanocrystal:doping metal". For example, the core 130 may be expressed in the form of III-II-V:M, or in the form of InZnP:Sr or InZnP:Ba.

The doping metal 120 may be positioned inside the core 130 and on the surface of the core 130. Depending on the type of the doping metal 120, the doping metal 120 may be positioned in the boundary between the core 130 and the shell 150 to remove or reduce the lattice mismatch between the core 130 and the shell 150, thereby reducing surface defects and increasing quantum efficiency.

The doping metal 120 is selected from alkaline metals and alkaline earth metals. The doping metal 120 may be, for example, one or more selected from Sr, Ba, Be, Ca, Mg, Li, Na, K, and Rb. For example, the doping metal 120 may be one or more selected from Sr and Ba.

When the doping metal 120 is selected from alkaline metals and alkaline earth metals, the bonding between the group V element in the first semiconductor nanocrystal 110 and the doping metal 120 has reduced covalent bonding properties and increased ion bonding properties, due to a significant difference in the electronegativity between the group V element and the doping metal 120. When the ion bonding properties is increased, the atoms of the core 130 are more regularly arranged and crystallinity is improved. As a result, the lattice mismatch between the core 130 and the shell 150 is reduced, and trap sites that could reduce the quantum efficiency is also reduced.

The ratio A:B between the number of moles A of the group III element and the number of moles B of the doping metal 120 may range from 1:0.001 to 1:0.2 or 1:0.01 to 1:0.2. When the ratio A:B between the number of moles A of the group III element and the number of moles B of the doping metal 120 meets the above-described range, the doping metal 120 may fill in the defects inside and on the surface of the first semiconductor nanocrystal 110 to improve the crystallinity of the core 130, thereby reducing the FWHM of the quantum dot 100 and improving quantum efficiency. In addition, a phenomenon in which the doping metal 120 serves as an impurity to reduce optical properties of the quantum dot 100 may also be prevented.

The quantum dot 100 may include the shell 150 including a second semiconductor nanocrystal 140. The shell 150 is positioned to surround the outer surface of the core 130. The shell 150 may coat the outer surface of the core 130 to prevent surface defects of the nanocrystal, thereby improving stability.

The second semiconductor nanocrystal 140 may include a group VI element. For example, the second semiconductor nanocrystal 140 may include one or more selected from II-VI group compounds, III-VI group compounds, and IV-VI group compounds. For example, the second semiconductor nanocrystal 140 may include a II-VI group compound.

The group II element of the second semiconductor nanocrystal 140 may be one or more selected from Zn, Cd, and Hg. MN The ratio A:B between the number of moles A of the group III element in the quantum dot 100 and the number of moles B of the group II element in the quantum dot 100 may range from 1:16 to 1:25, 1:18 to 1:23, or 1:20 to 1:22. The number of moles A of the group III element in the quantum dot 100 refers to the number of moles of the entire group III element in the quantum dot 100. For example, when the quantum dot 100 has a core/shell structure, the number of moles A of the group III element in the quantum dot 100 may refer to a total of the number of moles of the group III element in the core 130 and the number of moles of the group III element in the shell 150. The number of moles B of the group II element in the quantum dot 100 also refers to the number of moles of the entire group II element in the quantum dot 100. When the ratio A:B between the number of moles A of the group III element in the quantum dot 100 and the number of moles B of the group II element in the quantum dot 100 meets the above-described range, the quantum dot 100 may have a narrow FWHM and superior quantum efficiency.

The quantum dot 100 should include a sufficient number of atoms of the group II element so that the ratio A:B between the number of moles A of the group III element in the quantum dot 100 and the number of moles B of the group II element in the quantum dot 100 meets the above-described range. In order to form the quantum dot 100 including a sufficient number of atoms of the group II element, metal OXO clusters, for example, may be used as the precursor of the group II element.

The group III element in the second semiconductor nanocrystal 140 may be one or more selected from Al, Ga, In, and Ti.

The group IV element in the second semiconductor nanocrystal 140 may be one or more selected from Si, Ge, Sn, and Pb.

The group VI element in the second semiconductor nanocrystal 140 may be one or more selected from O, S, Se, and Te. The group VI element may be referred to as a chalcogen element.

The second semiconductor nanocrystal 140 may be one or more selected from CdS, CdSe, CdTe, ZnS, ZnSe, ZnTe, ZnSeS, PbS, PbSe, PbSeS, PbTe, GaAs, GaP, InP, InGaP, InZnP, InAs, CuS, InN, GaN, InGaN, AlP, AlAs, InAs, GaAs, GaSb, InSb, AlSb, HgS, HgTe, HgCdTe, ZnCdS, ZnCdSe, CdSeTe, CuInSe$_2$, CuInS$_2$, AgInS$_2$, and SnTe.

The structure of the core 130 including the first semiconductor nanocrystal 110 and the doping metal 120 and the shell 150 including the second semiconductor nanocrystal 140 may be expressed in the form of "core:doping metal/shell", "core:doping metal/shell/shell", "first semiconductor nanocrystal:doping metal/second semiconductor nanocrystal", "first semiconductor nanocrystal:doping metal/second semiconductor nanocrystal/third semiconductor nanocrystal", or the like. For example, the structure of the shell may be expressed in the form of InZnP:Sr/ZnSeS, InZnP:Ba/ZnSeS/ZnS, or the like.

The quantum dot 100 according to embodiments may have an emission wavelength ranging from 400 nm to 780 nm, 480 nm to 700 nm, or 500 nm to 700 nm.

The quantum dot 100 according to embodiments may have an FWHM ranging from 10 nm to 45 nm, 20 nm to 45 nm, or 35 nm to 42 nm.

The average diameter of the core 130 may range from 1 nm to 5 nm, whereas the thickness of the shell may range from 0.5 nm to 7 nm. When the diameter of the core and the thickness of the shell meet the above-described ranges, the quantum dot 100 may emit visible wavelength light while having superior efficiency.

Figure 2:
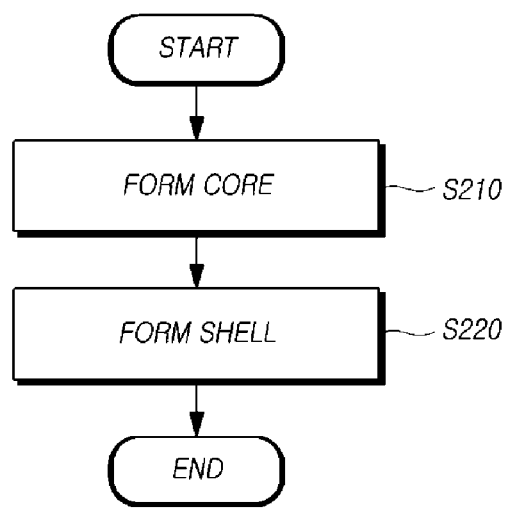
FIG. 2 is a flowchart of a method of manufacturing a quantum dot.

FIG. 2 is a flowchart of a method of manufacturing a quantum dot.

Referring to FIG. 2, according to another aspect, embodiments of the present disclosure may provide a method 200 of manufacturing a quantum dot.

The method 200 of manufacturing a quantum dot according to embodiments includes a core 130 forming step of forming a core at S210 including a first semiconductor nanocrystal 110 including a group II element, a group III element, and a group V element and a doping metal 120.

In the method 200 of manufacturing a quantum dot according to embodiments, features of the quantum dot 100, the core 130, the first semiconductor nanocrystal 110, and the doping metal 120 are the same as those of the quantum dot 100, the core 130, the first semiconductor nanocrystal 110, and the doping metal 120 described above for the quantum dot 100 according to embodiments, unless clearly stated otherwise.

The core forming step at S210 may be a step of doping the first semiconductor nanocrystal 110 including a group III-II-V compound with the doping metal 120 by a nucleation-doping method.

The method 200 of manufacturing a quantum dot according to embodiments may include a shell-forming step of forming a shell at S220. The core forming step at S210 and the shell-forming step at S220 may be performed by a one-pot reaction.

For example, the method 200 of manufacturing a quantum dot may include not only the core forming step (first step) at S210 and the shell-forming step (second step) at S220 but also a refining step (third step). The names of the respective steps are only given to be distinguished from each other, and the steps are not limited to the names.

The core forming step (first step) at S210 may be performed by a hot injection method. The core forming step at S210 is a step of forming a III-II-V:M core in which the first semiconductor nanocrystal 110 including the group III element, the group II element, and the group V metal is doped with a doping metal (M, 120).

The core forming step (first step) at S210 may include 1-1 and 1-2 steps.

The 1-1 step may be a step of raising the temperature to a temperature range of from 100° C. to 200° C. while decompressing a mixture solution in which a doping metal precursor and a group II element precursor solution are added to a group III element precursor solution. The raising of the temperature may be performed for 5 to 20 minutes. After the raising of the temperature is performed, the mixture solution may be subjected to a reaction for 50 to 100 minutes. When the temperature of the mixture solution is raised to this temperature range, impurities in the precursor may be effectively removed, so that a quantum dot 100 may be efficiently grown.

The 1-2 step may be a step of raising the temperature of the temperature-raised mixture solution to a temperature range of from 200° C. to 400° C. in an inert atmosphere and adding a group V element precursor solution to the temperature-raised mixture solution. The raising of the temperature may be performed for several seconds to 1 hour. When the temperature is raised to this temperature range, a quantum dot 100 emitting visible wavelength light may be effectively formed.

The group III element precursor solution may include a group III element precursor, a solvent, and a surfactant. The group III element precursor is not particularly limited as long as the group III element precursor is a precursor including a group III element, such as a halogen salt of a group III element.

For example, when the group III element is indium, the group III element precursor may be one or more selected from the group consisting of indium(III)acetylacetonate), indium chloride (indium(III)chloride), indium acetate (indium(III)acetate), trimethylindium (TMI), alkyl indium, aryl indium, indium myristate (indium(III)myristate), and indium myristate acetate (indium(III)myristate acetate). For example, the group III element precursor may be one or more selected from indium acetylacetonate (indium(III) acetylacetonate) and indium chloride (indium(III)chloride).

The solvent used in the group III element precursor solution may be one or more selected from the group consisting of 2,6,10,15,19,23-hexamethyl tetracosane (squalane), 1-octadecene (OED), trioctylamine (TOA), tributylphosphine oxide, octadecene, octadecylamine, trioctylphosphine (TOP), and trioctylphosphine oxide (TOPO).

The surfactant may be selectively used. The surfactant may be may be a carboxylic acid-based compound, a phosphonic acid-based compound, or a mixture thereof.

The carboxylic acid-based compound may be one or more selected from the group consisting of oleic acid, palmitic acid, stearic acid, linoleic acid, myristic acid, and lauric acid. The phosphonic acid-based compound may be one or more selected from the group consisting of hexylphosphonic acid, octadecylphosphonic acid, tetradecylphosphonic acid, hexadecylphosphonic acid, decylphosphonic acid, octylphosphonic acid, and butylphosphonic acid.

The doping metal precursor solution includes one or two of an alkaline metal and an alkaline earth metal, and a solvent. The doping metal precursor may be one or more selected from the group consisting of, for example, strontium acetate, strontium acetylacetonate hydrate, strontium bromide, strontium chloride, strontium fluoride, strontium iodide, barium acetate, barium acetylacetonate hydrate, barium bromide, barium chloride, barium fluoride, barium iodide, beryllium oxide, beryllium acetate, beryllium acetylacetonate hydrate, beryllium bromide, beryllium chloride, beryllium fluoride, beryllium iodide, calcium acetate, calcium acetylacetonate hydrate, calcium bromide, calcium chloride, calcium fluoride, calcium iodide, magnesium acetate, magnesium acetylacetonate hydrate, magnesium bromide, magnesium chloride, magnesium fluoride, magnesium iodide, lithium acetate, lithium acetylacetonate hydrate, lithium bromide, lithium chloride, lithium fluoride, lithium iodide, sodium acetate, sodium acetylacetonate hydrate, sodium bromide, sodium chloride, sodium fluoride, sodium iodide, potassium acetate, potassium acetylacetonate hydrate, potassium bromide, potassium chloride, potassium fluoride, and potassium iodide.

The solvent used in the doping metal precursor may be trioctylphosphine (TOP), tributylphosphine (TBP), octadecene (ODE), or amines (e.g., primary amine, secondary amine, and third amine). The molar concentration of the doping metal precursor solution may range, for example, from 0.001 M to 2 M.

The group II element precursor solution may include a group II element precursor and a solvent.

The group II element precursor may be, for example, a carboxylate of the group II element M. The carboxylate may be represented by $M(carboxylate)_n$. For example, when the group II element is zinc (Zn), the carboxylate may be $Zn(oleate)_2$, but the type of the group II element precursor is not limited to $Zn(oleate)_2$.

The carboxylate may be manufactured by mixing a group II element preliminary precursor with carboxyl acid. For example, when the group II element is Zn, the group II element preliminary precursor may be one or more selected from the group consisting of dimethyl zinc, diethyl zinc, zinc acetate, zinc acetate dihydrate, zinc acetylacetonate, zinc acetylacetonate hydrate, zinc iodide, zinc bromide, zinc chloride, zinc fluoride, zinc fluoride tetrahydrate, zinc carbonate, zinc cyanide, zinc nitrate, zinc nitrate hexahydrate, zinc oxide, zinc peroxide, zinc perchlorate, zinc perchlorate hexahydrate, zinc sulfate, diphenyl zinc, zinc naphthenate, or zinc stearate.

Carboxyl acid for the manufacture of the carboxylate of the group II element M may be one or more selected from the group consisting of, for example, palmitic acid, myristic acid, oleic acid, and stearic acid.

For example, when the group II element precursor is $Zn(oleate)_2$, $Zn(oleate)_2$ may be manufactured by reacting zinc acetate and oleic acid.

The group II element precursor may be, for example, a metal OXO cluster. For example, when the group II element is Zn, the metal OXO cluster may be a Zn OXO cluster.

The metal OXO cluster may be expressed by the following Formula 1:

$$T_xO_y(carboxylate)_z \qquad (1)$$

In Formula 1, T is a metal. T may be one or more selected from the group consisting of Zn, Mn, Cu, Fe, Ni, Co, Cr, Ti, Zr, Nb, Mo, and Ru.

Each of x, y, and z is a natural number, x>y, and x+y=z or 2x=2y+z.

The metal OXO cluster may be one or more selected from the group consisting of, for example, $Zn_7O_2(carboxylate)_9$, $Zn_4O(carboxylate)_5$, $Zn_4O(carboxylate)_6$, and $Zn_7O_2(carboxylate)_{10}$.

The metal OXO cluster may be manufactured by heating a solution including the carboxylate of the group II element M described above. For example, when the group II element is Zn, a Zn OXO cluster, such as $Zn_7O_2(carboxylate)_9$, $Zn_4O(carboxylate)_5$, $Zn_4O(carboxylate)_6$, or $Zn_7O_2(carboxylate)_{10}$, may be formed from $Zn(oleate)_2$ by pyrolysis.

The carboxylate is a salt of carboxyl acid or a carboxylate ester. The salt of carboxyl acid may be expressed by the following Formula 2, and carboxylate ester may be expressed by the following Formula 3:

$$M(RCOO)_n \quad (2)$$

$$RCOOR' \quad (3)$$

In the Formula 2 or 3, M is a metal, n is a natural number, R and R' are hydrogen or an organic group.

The metal refers to a metal, such as an alkaline metal, an alkaline earth metal, or a transition metal, and the natural number refers to a positive integer.

The organic group may be one or more selected from the group consisting of, but is not limited to, deuterium; halogen; a silane group; a boron group; a germanium group; an amide group; an amide group; an amino group; a cyano group; a nitrile group; a nitro group; a $C_6$-$C_{60}$ aryl group; a fluorenyl group; a $C_2$-$C_{60}$ heterocyclic group including at least one heteroatom selected from the group consisting of O, N, S, Si, and P; a fused ring group of a $C_3$-$C_{60}$ aliphatic ring and a $C_6$-$C_{60}$ aromatic ring; a $C_1$-$C_{50}$ alkyl group; a $C_1$-$C_{50}$ alkoxyl group; a $C_6$-$C_{50}$ aryloxy group; a $C_1$-$C_{50}$ alkylamine group; a $C_6$-$C_{50}$ arylamine group; a $C_1$-$C_{50}$ alkylthio group; a $C_6$-$C_{50}$ arylthio group; a $C_2$-$C_{50}$ alkenyl group; a $C_2$-$C_{50}$ alkynyl group; a $C_3$-$C_{50}$ cycloalkyl group; a $C_8$-$C_{50}$ arylalkenyl group; a $C_7$-$C_{50}$ arylalkyl group; and combinations thereof.

When the organic group is an aryl group, the organic group may be, particularly, a $C_6$-$C_{30}$ aryl group, and more particularly, a $C_6$-$C_{18}$ aryl group, for example, phenyl, biphenyl, naphthyl, or terphenyl.

When the organic group is a heterocyclic group, the organic group may be, particularly, a $C_2$-$C_{30}$ heterocyclic group, and more particularly, a $C_2$-$C_{16}$ heterocyclic group.

When the organic group is a fluorenyl group, the organic group may be 9,9-dimethyl-9H-fluorene, 9,9-diphenyl-9H-fluorenyl group, 9,9'-spirobifluorene, or the like.

When the organic group is an alkyl group, the organic group may be, particularly, a $C_1$-$C_{20}$ alkyl group, and more particularly, a $C_1$-$C_{10}$ alkyl group, for example, methyl or t-butyl.

When the organic group is an alkoxy group, the organic group may be, particularly, a $C_1$-$C_{20}$ alkoxyl group, and more particularly, a $C_1$-$C_{10}$ alkoxyl group, for example, methoxy or t-butoxy.

When the organic group is an aryloxy group, the organic group may be, particularly, a $C_6$-$C_{30}$ aryloxy group, and more particularly, a $C_6$-$C_{18}$ aryloxy group.

When the organic group is an alkylamine group, the organic group may be, particularly, a $C_1$-$C_{20}$ alkylamine group, and more particularly, a $C_1$-$C_{10}$ alkylamine group.

When the organic group is an arylamine group, the organic group may be, particularly, a $C_6$-$C_{30}$ arylamine group, and more particularly, a $C_6$-$C_{20}$ arylamine group.

When the organic group is an alkylthio group, the organic group may be, particularly, a $C_1$-$C_{20}$ alkylthio group, and more particularly, a $C_1$-$C_{10}$ alkylthio group.

When the organic group is an arylthio group, the organic group may be, particularly, a $C_6$-$C_{30}$ arylthio group, and more particularly, a $C_6$-$C_{20}$ arylthio group.

When the organic group is an alkenyl group, the organic group may be, particularly, a $C_2$-$C_{20}$ alkenyl group, and more particularly, a $C_2$-$C_{10}$ alkenyl group.

When the organic group is an alkynyl group, the organic group may be, particularly, a $C_2$-$C_{20}$ alkynyl group, and more particularly, a $C_2$-$C_{10}$ alkynyl group.

When the organic group is a cycloalkyl group, the organic group may be, particularly, a $C_3$-$C_{30}$ cycloalkyl group, and more particularly, a $C_3$-$C_{20}$ cycloalkyl group.

When the organic group is an arylalkenyl group, the organic group may be, particularly, a $C_8$-$C_{30}$ arylalkenyl group, and more particularly, a $C_8$-$C_{20}$ arylalkenyl group.

When the organic group is an arylalkyl group, the organic group may be, particularly, a $C_7$-$C_{30}$ arylalkyl group, and more particularly, a $C_7$-$C_{20}$ arylalkyl group.

Each of R and R' may be substituted with one or more substituents selected from the group consisting of deuterium; halogen; a silane group substituted or unsubstituted with a $C_1$-$C_{20}$ alkyl group or a $C_6$-$C_{20}$ aryl group; a siloxane group; a boron group; a germanium group; a cyano group; a nitro group; a $C_1$-$C_{20}$ alkylthio group; a $C_1$-$C_{20}$ alkoxy group; a $C_6$-$C_{20}$ aryloxy group; a $C_6$-$C_{20}$ arylthio group; a $C_1$-$C_{20}$ alkyl group; a $C_1$-$C_{20}$ alkylamine group; a $C_6$-$C_{20}$ arylamine group; a $C_2$-$C_{20}$ alkenyl group; a $C_2$-$C_{20}$ alkynyl group; a $C_6$-$C_{20}$ aryl group; a fluorenyl group; a $C_2$-$C_{20}$ heterocyclic group including at least one heteroatom selected from the group consisting of O, N, S, Si, and P; a $C_3$-$C_{20}$ aliphatic group; a $C_7$-$C_{20}$ arylalkyl group; and a $C_8$-$C_{20}$ arylalkenyl group.

The solvent used in the group II element precursor solution may be one or more selected from the group consisting of 2,6,10,15,19,23-hexamethyltetracoic acid (squalane), 1-octadecene (ODE), trioctylamine (TOA), tributylphosphine oxide, octadecene, octadecylamine, trioctyl Phosphine (TOP), and trioctylphosphine oxide (TOPO).

The group V element precursor solution includes a group V element precursor and a solvent.

The group V element precursor may be organometallic phosphorus, i.e., one or more organic metals selected from the group consisting of tris(trimethylsilyl)phosphine (TMSP), aminophosphine, white phosphorus, tri(pyrazolyl) phosphane), and calcium phosphide. For example, the group V element precursor may be one or more selected from the group consisting of tris(trimethylsilyl)phosphine and aminophosphine.

The solvent used in the group V element precursor solution may be, for example, trioctylphosphine (TOP), tributylphosphine (TBP), octadecene (ODE), or amines (e.g., primary amine, secondary amine, and third amine).

The group V element precursor solution may include an alkylphosphine-based surfactant. When the alkylphosphine-based surfactant is added to the group V element precursor solution, the group V element and the alkylphosphine-based surfactant may be bonded to form an organic composite. Thus, a more stable reaction is possible, and these features are more suitable for mass production. In addition, the size of the quantum dot manufactured may be adjusted by changing the type of the alkylphosphine-based surfactant.

The alkylphosphine-based surfactant may be one or more selected from the group consisting of triethyl phosphine, tributyl phosphine, trioctyl phosphine, triphenyl phosphine, and tricyclohexyl phosphine.

The shell-forming step (second step) at S220 is a step of forming the shell 150 on the surface of the core 130 after the core forming step at S210. The shell-forming step at S220 includes 2-1, 2-2, and 2-3 steps.

In the method of manufacturing a quantum dot 100 according to embodiments, features of the shell 150 of the quantum dot 100 are the same as those of the shell 150 of the quantum dot 100 described above according to embodiments, unless clearly stated otherwise.

The 2-1 step cools the solution obtained in the core forming step at S210 to a temperature of from 100° C. to 250° C. Afterwards, the shell 150 is formed by adding one or both of a group III element precursor solution and a group V element precursor solution or adding one or both of a group II element precursor solution and a group VI element precursor solution. That is, the shell 150 is formed by adding one or both of a group II element precursor and a group VI element precursor or one or both of a group III element precursor and a group V element precursor.

The 2-2 step is a step of raising the temperature of the solution obtained in the 2-1 step for 10 to 120 minutes, followed by a reaction for 2 to 4 hours. When the temperature exceeds the above temperature range, shell coating is not efficient, which is problematic.

The 2-3 step is a step of cooling the solution obtained in the 2-2 step to room temperature by blowing an inert gas thereto. When the inert gas is not blown to the solution, the surface of the quantum dot may be oxidized by the air blown at a high temperature, which is problematic.

The refining step (third step) includes 3-1, 3-2, and 3-3 steps.

The 3-1 step is a step of inputting the solution after the shell-forming step into a centrifugal vessel. Centrifugation is performed by adding, for example, an alcoholic solvent and a polar solvent (e.g., 2-propanol). Due to the centrifugation, a deposit is obtained by removing a supernatant liquid.

In addition, in the centrifugation, the number of revolutions may be 1000 rpm or 20000 rpm.

The 3-2 step is a step of dissolving the deposit with an organic solvent, such as hexane, toluene, octadecane, or heptane.

The 3-3 step is a step of storing the deposit dissolved in a non-polar solvent after repeating the 3-1 step and the 3-2 step at least once.

In another aspect, according to embodiments, an electronic device including a quantum dot may be provided. The electronic device may be, for example, a light-emitting device, a high brightness light-emitting diode (LED), or a biosensor.

In the electronic device according to embodiments, features of the quantum dot 100 are the same as those of the quantum dot 100 described above according to embodiments, unless clearly stated otherwise.

Figure 3:
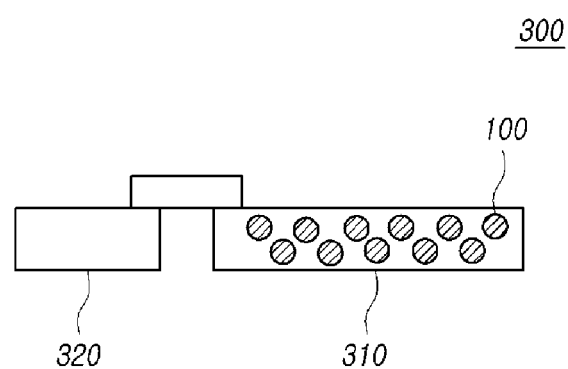
FIG. 3 is a diagram illustrating a display device according to embodiments.

In addition, another aspect of the present disclosure relates to electronic apparatuses each including the above-described electronic device. The electronic apparatus may be, for example, a display device, a solar cell, a bio-diagnostic device. For example, the display device 300 may include a display panel 310 including quantum dots 100 and a controller 320 controlling the display panel 310, as described in FIG. 3.

Since those having ordinary knowledge in the art may easily make a variety of applications of the electronic device and apparatus using the quantum dot 100, detailed descriptions thereof will be omitted.

Hereinafter, embodiments of the present disclosure will be described in detail as, while not being limited to, synthesis examples and experimental examples.

Synthesis Examples (1) Manufacture of Group II Element Precursor Solution Including $Zn(oleate)_2$ 1. Zn acetate 5.5 g (30 mmol) and oleic acid 19 mL (60 mmol) were added to a 250 mL flask, followed by decompression at room temperature (RT) for 1 hour. In the decompressed state, the temperature was raised to 180° C. for 10 minutes, and then a reaction was performed for 2 hours.

2. The mixture solution was subjected to an Ar atmosphere, 41 mL octadecene was added, and the temperature was lowered to room temperature.

The concentration of the mixture solution was 0.5 M, and when 1 mL of the mixture solution was taken, 0.5 mmol $Zn(oleate)_2$ was added.

(2) Manufacture of Group II Element Precursor Solution Including ZnOXO

1. Zn acetate 5.5 g (30 mmol) and oleic acid 19 mL (60 mmol) were added to a 250 mL flask, followed by decompression at room temperature (RT) for 1 hour, thereby forming a 0.5 mmol $Zn(oleate)_2$ solution.

2. In the decompressed state of the $Zn(oleate)_2$ solution, the temperature was raised to 180° C. for 20 minutes, and then a reaction was performed for 2 hours.

3. In the decompressed state of the resultant solution, the temperature was raised to 300° C. for 10 minutes, and then a reaction was performed for 20 minutes.

4. The mixture solution was subjected to a $N_2$ atmosphere, 41 mL octadecene was added, and the temperature was lowered to room temperature. The concentration of the mixture solution was 0.5 M.

(3) Manufacture of Example 1

Manufacture of Quantum Dot (InZnP:Sr/ZnS)

1. An In precursor solution 2 mL (group III element precursor: $InCl_3$, solvent: trioctylphosphine (TOP) 20 ml, amount of group III element precursor: 100 mmol), Sr acetate 0.411 g (2 mmol), and a precursor solution 400 mL (solvent: octadecene (ODE)) containing $Zn(oleate)_2$ manufactured in (1) above were added to a flask, followed by stirring.

2. The temperature was raised to 110° C. for 10 minutes while the mixture solution was being decompressed, and then the mixture solution was stirred for 1 hour.

3. The pretreated mixture solution was converted into a $N_2$ gas atmosphere, and then the temperature was raised to 280° C., i.e., the precursor pyrolysis temperature, for 10 minutes. When the temperature reached 280° C., a 2.7 mL Tris(trimethylsilyl)phosphine (TMSP) solution was added.

4. The resultant solution was reacted at 280° C. for 1 hour, and then was cooled to 150° C. by blowing a $N_2$ gas thereto, thereby manufacturing an InZnP:Sr core.

5. When the solution containing the core synthesized above was 150° C., TOP-S 3 mL (S (30 mmol)+TOP (3 mL)) was added. Here, the amount of S added was 3 mmol, and the mole ratio of the precursors was In:Zn:P:S=1:20:0.7:3.

6. All of shell materials were added, the temperature of the resultant solution was raised to 300° C. for 10 minutes, followed by reaction for 3 hours.

7. The resultant solution was cooled to room temperature (RT) by blowing a $N_2$ gas thereto, thereby forming a ZnS shell on the InZnP:Sr core.

(4) Manufacture of Example 2 (InZnP:Sr/ZnS)

A quantum dot was manufactured in the same manner as in Example 1, except that Sr acetate 0.0025 g (0.01 mmol) was used in place of Sr acetate 0.411 g (2 mmol) of Example 1. In the quantum dots manufactured, a ZnS shell was formed on an InZnP:Sr core, respectively.

(5) Manufacture of Example 3 (InZnP:Ba/ZnS)

A quantum dot was manufactured in the same manner as in Example 1, except that Ba acetate 0.510 g (2 mmol) was used in place of Sr acetate 0.411 g (2 mmol) of Example 1. In the quantum dots manufactured, a ZnS shell was formed on an InZnP:Ba core.

(6) Manufacture of Example 4 (InZnP:Ba/ZnS)

A quantum dot was manufactured in the same manner as in Example 1, except that Ba acetate 0.0025 g (0.01 mmol) was used in place of Sr acetate 0.411 g (2 mmol) of Example 1. In the quantum dots manufactured, a ZnS shell was formed on an InZnP:Ba core.

(7) Manufacture of Example 5 (InZnP:Li/ZnS)

A quantum dot was manufactured in the same manner as in Example 1, except that Li acetate 0.1319 g (2 mmol) was used in place of Sr acetate 0.411 g (2 mmol) of Example 1. In the quantum dots manufactured, a ZnS shell was formed on an InZnP:Li core.

(8) Manufacture of Example 6 (InZnP:Li/ZnS)

A quantum dot was manufactured in the same manner as in Example 1, except that Li acetate 0.0065 g (0.01 mmol) was used in place of Sr acetate 0.411 g (2 mmol) of Example 1. In the quantum dots manufactured, a ZnS shell was formed on an InZnP:Li core.

(9) Manufacture of Example 7 (InZnP:Mg/ZnS)

A quantum dot was manufactured in the same manner as in Example 1, except that Mg acetate 0.2847 g (2 mmol) was used in place of Sr acetate 0.411 g (2 mmol) of Example 1. In the quantum dots manufactured, a ZnS shell was formed on an InZnP:Mg core.

(10) Manufacture of Example 8 (InZnP:Mg/ZnS)

A quantum dot was manufactured in the same manner as in Example 1, except that Mg acetate 0.0014 g (0.01 mmol) was used in place of Sr acetate 0.411 g (2 mmol) of Example 1. In the quantum dots manufactured, a ZnS shell was formed on an InZnP:Mg core.

(11) Manufacture of Example 9 (InZnP:Ca/ZnS)

A quantum dot was manufactured in the same manner as in Example 1, except that Ca acetate 0.3163 g (2 mmol) was used in place of Sr acetate 0.411 g (2 mmol) of Example 1. In the quantum dots manufactured, a ZnS shell was formed on an InZnP:Ca core.

(12) Manufacture of Example 10 (InZnP:Ca/ZnS)

A quantum dot was manufactured in the same manner as in Example 1, except that Ca acetate 0.0015 g (0.01 mmol) was used in place of Sr acetate 0.411 g (2 mmol) of Example 1. In the quantum dots manufactured, a ZnS shell was formed on an InZnP:Ca core.

(13) Manufacture of Example 11 (ZnOXO cluster)

Manufacture of Quantum Dot (InZnP:Sr/ZnS)

1. An In precursor solution 2 mL (group III element precursor: $InCl_3$, solvent: trioctylphosphine (TOP) 20 ml, amount of group III element precursor: 100 mmol), Sr acetate 0.411 g (2 mmol), and a precursor solution 400 mL (solvent: octadecene) containing Zn(oleate)$_2$ manufactured in (2) above were added to a flask, followed by stirring.

2. The temperature was raised to 110° C. for 10 minutes while the mixture solution was being decompressed, and then the mixture solution was stirred for 1 hour.

3. The pretreated mixture solution was converted into a $N_2$ gas atmosphere, and then the temperature was raised to 280° C., i.e., the precursor pyrolysis temperature, for 10 minutes. When the temperature reached 280° C., a 2.7 mL TMSP solution was added.

4. The resultant solution was reacted at 280° C. for 1 hour, and then was cooled to 150° C. by blowing a $N_2$ gas thereto, thereby manufacturing an InZnP:Sr core.

5. When the solution containing the core synthesized above was 150° C., TOP-S 3 mL (S (30 mmol)+TOP (3 mL)) was added. Here, the amount of S added was 3 mmol, and the mole ratio of the precursors was In:Zn:P:S=1:20:0.7:3.

6. All of shell materials were added, the temperature of the resultant solution was raised to 300° C. for 10 minutes, followed by reaction for 3 hours.

7. The resultant solution was cooled to room temperature (RT) by blowing a $N_2$ gas thereto, thereby forming a ZnS shell on the InZnP:Sr core.

(14) Manufacture of Example 12 (InZnP:Sr/ZnS)

A quantum dot was manufactured in the same manner as in Example 11, except that Sr acetate 0.0025 g (0.01 mmol) was used in place of Sr acetate 0.411 g (2 mmol) of Example 11. In the quantum dots manufactured, a ZnS shell was formed on an InZnP:Sr core.

(15) Manufacture of Comparative Example 1 (InZnP/ZnS)

A quantum dot was manufactured in the same manner as in Example 1, except that Sr acetate 0.411 g (2 mmol) of Example 1 was not used. In the quantum dots manufactured, a ZnS shell was formed on an InZnP core.

(16) Manufacture of Comparative Example 2 (InZnP:Cu/ZnS)

A quantum dot was manufactured in the same manner as in Example 1, except that Cu acetate 0.9081 g (5 mmol) was used in place of Sr acetate 0.411 g (2 mmol) of Example 1. In the quantum dots manufactured, a ZnS shell was formed on an InZnP:Cu core.

(17) Manufacture of Comparative Example 3 (InZnP:Mg/ZnS)

A quantum dot was manufactured in the same manner as in Example 1, except that Mg acetate 0.7119 g (5 mmol) was used in place of Sr acetate 0.411 g (2 mmol) of Example 1. In the quantum dots manufactured, a ZnS shell was formed on an InZnP:Mg core.

Experimental Example

The quantum dots manufactured as above according to Examples 1 to 12 and Comparative Examples 1 to 3 were dissolved with hexane and irradiated with 450 nm light using Otsuka Electronics QE-2000, and photoluminescence data (i.e., emission peak, quantum yield, and FWHM) thereof were reviewed. Table 1 below illustrate evaluation results of the photoluminescence data.

TABLE 1

| | Structure | Doping metal (M) precursor | M/In | Zn/In (core) | Zn/In* | λmax | FWHM | Qγ (%) |
|---|---|---|---|---|---|---|---|---|
| Comp. Ex. 1 | InZnP/ZnS | — | — | 0.9 | 12 | 530.0 | 56.0 | 60.0 |
| Comp. Ex. 2 | InZnP:Cu/ZnS | Cu acetate | 0.5 | 0.6 | 11 | 535.0 | 55.5 | 61.3 |
| Comp. Ex. 3 | InZnP:Mg/ZnS | Mg acetate | 0.5 | 0.6 | 11 | 540.0 | 48.0 | 62.7 |
| Ex. 1 | InZnP:Sr/ZnS | Sr acetate | 0.2 | 0.7 | 13 | 531.3 | 37.8 | 76.9 |
| Ex. 2 | InZnP:Sr/ZnS | Sr acetate | 0.01 | 0.8 | 15 | 528.7 | 40.1 | 72.1 |
| Ex. 3 | InZnP:Ba/ZnS | Ba acetate | 0.2 | 0.7 | 14 | 530.5 | 37.4 | 75.2 |
| Ex. 4 | InZnP:Ba/ZnS | Ba acetate | 0.01 | 0.8 | 16 | 527.2 | 40.4 | 71.4 |
| Ex. 5 | InZnP:Li/ZnS | Li acetate | 0.2 | 0.8 | 13 | 532.1 | 38.7 | 72.8 |
| Ex. 6 | InZnP:Li/ZnS | Li acetate | 0.01 | 0.9 | 14 | 530.7 | 41.3 | 68.5 |
| Ex. 7 | InZnP:Mg/ZnS | Mg acetate | 0.2 | 0.7 | 16 | 531.6 | 38.2 | 72.3 |
| Ex. 8 | InZnP:Mg/ZnS | Mg acetate | 0.01 | 0.7 | 16 | 528.2 | 40.9 | 67.6 |
| Ex. 9 | InZnP:Ca/ZnS | Ca acetate | 0.2 | 0.7 | 13 | 531.9 | 38.7 | 71.8 |
| Ex. 10 | InZnP:Ca/ZnS | Ca acetate | 0.01 | 0.8 | 15 | 529.1 | 41.5 | 69.4 |
| Ex. 11 | InZnP:Sr/ZnS | Sr acetate | 0.2 | 7 | 20 | 529.0 | 37.8 | 89.3 |
| Ex. 12 | InZnP:Sr/ZnS | Sr acetate | 0.01 | 8 | 22 | 527.7 | 38.5 | 84.9 |

Note)
Zn/In*: Zn/In (core/shell)

Referring to Table 1, Examples 1 to 12 according to the present disclosure, in which the alkaline metal or the alkaline earth metal was used as the doping metal and the molar ratio of the alkaline metal or the alkaline earth metal with respect to the group III element was in the range of from 1:0.01 to 1:0.2, had significantly better results in terms of FWHM and efficiency than Comparative Example 1, in which no doping metal was used in the InZnP, Comparative Example 2, in which the transition metal (Cu) was used as the doping metal, and Comparative Example 3, in which the alkaline earth metal was used as the doping metal and the molar ratio of the alkaline earth metal with respect to the group III element was 1:0.5.

In other words, the results of Comparative Examples 2 and 3 in which the doping metal was used were better than those of Comparative Example 1 in which no doping metal was used in the InZnP core, and the result of Comparative Example 3 in which the alkaline earth metal (Mg) was used as the doping metal were better than those of Comparative Example 2 in which the transition metal (Cu) was used as the doping metal.

Calculating the difference of the electronegativity between phosphine and the doping metal, the difference in the electronegativity increases when the alkaline metal or the alkaline earth metal is used as the doping metal. Thus, the covalent bonding properties between phosphine and the doping metal is reduced and ion bonding properties between phosphine and the doping metal is increased.

When the ion bonding properties is increased, atoms of the quantum dot are regularly arranged and crystallinity is improved. Thus, the lattice mismatch between the core and the shell can be reduced, and trap sites reducing quantum efficiency can be relatively reduced.

In addition, each the alkaline metal and the alkaline earth metal has faster reactivity than the transition metal, and can react faster than the transition metal. Thus, the Ostwald ripening process may effectively occur, and the core may be formed uniformly. Consequently, an effect of the narrowed FWHM may be obtained.

Comparing Examples 1 to 12 with Comparative Example 3, the molar ratio with respect to the group III element is 1:0.5 in Comparative Example 3, whereas the molar ratio with respect to the group III element is 1:0.01 to 1:0.2 in Examples 1 to 12. It can also be confirmed that Examples 1 to 12 in which the molar ratio with respect to the group III element is 1:0.01 to 1:0.2 had better characteristics.

In other words, the optical properties of the quantum dot are improved with increases the content of the doping metal in the limited range but are degraded when the content of the doping metal exceeds the limited range.

It is regarded that, as the amount of doping increases in the limited range, the alkaline metal or alkaline earth metal fills in the internal defects of the core so as to improve the crystallinity of the core, thereby improving the optical properties.

In contrast, it is also regarded that, when the amount of doping exceeds the limited range, the alkaline metal or alkaline earth metal serves as an impurity to cause lattice defects between the core and the shell, thereby degrading the optical properties.

It can be appreciated that Examples 11 and 12 in which the OXO clusters were used in place of oleate for the synthesis of the quantum dots have better quantum efficiency and narrower FWHM than Examples 1 to 10. Thus, it can be appreciated that the quantum dots manufactured using the OXO clusters have much better optical properties.

It can be appreciated that the quantum dots manufactured using the ZnOXO clusters have a higher Zn content than the quantum dots manufactured using $Zn(oleate)_2$. The molar ratio of Zn to In in the core of each quantum dot in Examples 11 and 12 is 7 or 8, whereas the molar ratio of Zn to In in the core of the quantum dots in Examples 1 to 10 is 0.7 to 0.9, which is significantly smaller than that of Examples 11 and 12. In addition, the molar ratio of Zn to In in the entire quantum dot including the core and the shell in Examples 11 and 12 is 20 or 22, whereas the molar ratio of Zn to In in the entire quantum dot including the core and the shell in Examples 1 to 10 is 13 to 16, which is significantly smaller than that of Examples 11 and 12. Accordingly, the quantum dots manufactured using the metal OXO clusters have a high group II element content, thereby having high quantum efficiency and narrow FWHM.

The above description is only intended to illustrate the present disclosure, and those having ordinary knowledge in the art to which the present disclosure pertains could make various modifications without departing from the essential features of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A quantum dot comprising:
   a core comprising a first semiconductor nanocrystal and a doping metal, the doping metal being positioned inside of the core; and
   a shell on the core comprising a second semiconductor nanocrystal,
   wherein the first semiconductor nanocrystal comprises a group II element, a group III element, and a group V element,
   the second semiconductor nanocrystal comprises a group II element and a group VI element,
   the doping metal is a material different from the group II element, the group III element, and the group V element of the first semiconductor nanocrystal and is selected from Sr, Ba, and Ca, and
   a ratio between the number of moles of the group III element of the first semiconductor nanocrystal and the number of moles of the doping metal ranges from 1:0.001 to 1:0.2.

2. The quantum dot of claim 1, wherein the ratio between the number of moles of the group III element of the first semiconductor nanocrystal and the number of moles of the doping metal ranges from 1:0.01 to 1:0.2.

3. The quantum dot of claim 1, wherein a ratio between the number of moles of the group III element in the first semiconductor nanocrystal and the number of moles of the group II element in the first semiconductor nanocrystal ranges from 1:5 to 1:10.

4. The quantum dot of claim 1, wherein the first semiconductor nanocrystal comprises In, Zn, and P.

5. The quantum dot of claim 1, wherein the doping metal comprises one or more selected from Sr and Ba.

6. The quantum dot of claim 1, wherein a ratio between the number of moles of the group III element in the quantum dot and the number of moles of the group II element in the quantum dot ranges from 1:16 to 1:25.

7. A method of manufacturing a quantum dot, the method comprising:
   a step of forming a core comprising a first semiconductor nanocrystal and a doping metal, and
   a step of forming a shell on the core,
   wherein the first semiconductor nanocrystal comprises a group II element, a group III element, and a group V element,
   the second semiconductor nanocrystal comprises a group II element and a group VI element,
   the doping metal is a material different from the group II element, the group III element, and the group V element of the first semiconductor nanocrystal and is selected from Sr, Ba, Be, and Ca, and
   a ratio between the number of moles of the group III element of the first semiconductor nanocrystal and the number of moles of the doping metal ranges from 1:0.001 to 1:0.2.

8. The method of claim 7, wherein the step of forming a core comprises:
   a step (1-1) of raising a temperature to a temperature range of from 100° C. to 200° C. while decompressing a mixture solution in which a doping metal precursor and a group II element precursor solution are added to a group III element precursor solution; and
   a step (1-2) raising the temperature of the mixture solution, the temperature of which has been raised in the step (1-1), to a temperature range of from 200° C. to 400° C. in an inert atmosphere and adding a group V element precursor solution to the temperature-raised mixture solution.

9. The method of claim 8, wherein the group II element precursor solution comprises a metal OXO cluster.

10. The method of claim 7, further comprising a step of forming a plurality of the shells surrounding the core.

11. An electronic device comprising the quantum dot of claim 1.

* * * * *